(12) United States Patent
Kilian

(10) Patent No.: US 6,786,654 B2
(45) Date of Patent: Sep. 7, 2004

(54) ENCAPSULATED OPTICAL FIBER END-COUPLED DEVICE

(75) Inventor: Arnd Kilian, Berlin (DE)

(73) Assignee: Hymite A/S, Lyngby (DK)

( * ) Notice: Subject to any disclaimer, the term of this patent is extended or adjusted under 35 U.S.C. 154(b) by 120 days.

(21) Appl. No.: 10/224,801

(22) Filed: Aug. 21, 2002

(65) Prior Publication Data

US 2004/0037519 A1 Feb. 26, 2004

(51) Int. Cl.[7] .................................................. G02B 6/36
(52) U.S. Cl. ........................................................ 385/94
(58) Field of Search ..................................... 385/92, 94

(56) References Cited

U.S. PATENT DOCUMENTS

| | | | |
|---|---|---|---|
| 4,210,923 A | 7/1980 | North et al. | |
| 4,466,696 A | 8/1984 | Carney | |
| 4,888,081 A | 12/1989 | Althaus et al. | |
| 4,890,895 A | 1/1990 | Zavracky et al. | |
| 4,897,711 A | 1/1990 | Blonder et al. | |
| 4,995,687 A | 2/1991 | Nagai et al. | |
| 5,073,003 A | 12/1991 | Clark | |
| 5,107,537 A | 4/1992 | Schriks et al. | |
| 5,109,455 A | 4/1992 | Niswonger | |
| 5,179,609 A | 1/1993 | Blonder et al. | |
| 5,181,216 A | 1/1993 | Ackerman et al. | |
| 5,243,673 A | 9/1993 | Johnson et al. | |
| 5,255,333 A | 10/1993 | Althaus et al. | |
| 5,367,591 A | 11/1994 | Seike et al. | |
| 5,384,872 A | 1/1995 | Jacobs-Cook et al. | |
| 5,392,373 A | 2/1995 | Essert | |
| 5,500,917 A | 3/1996 | Daniel et al. | |
| 5,522,000 A | 5/1996 | Ayliffe et al. | |
| 5,566,264 A | 10/1996 | Kuke et al. | |
| 5,586,207 A | 12/1996 | Goodwin | |
| 5,682,453 A | 10/1997 | Daniel et al. | |
| 5,721,797 A | 2/1998 | Basavanhally et al. | |
| 5,727,104 A | 3/1998 | Sasaki et al. | |
| 5,818,994 A | 10/1998 | Hehmann | |
| 5,970,200 A | 10/1999 | Takikawa et al. | |
| 6,074,104 A | 6/2000 | Higashikawa | |
| 6,092,935 A | 7/2000 | Althaus et al. | |
| 6,122,430 A | 9/2000 | Bookbinder et al. | |
| 6,227,724 B1 | 5/2001 | Verdiell | |
| 6,300,151 B1 | 10/2001 | Yoon et al. | |
| 6,318,910 B1 | 11/2001 | Higashikawa | |
| 6,367,988 B1 | 4/2002 | Auracher et al. | |
| 6,611,001 B2 * | 8/2003 | Cappuzzo et al. | 257/81 |
| 6,632,027 B1 * | 10/2003 | Yoshida et al. | 385/88 |
| 2003/0123800 A1 * | 7/2003 | Hashimoto et al. | 385/40 |
| 2003/0223709 A1 * | 12/2003 | Lake et al. | 385/94 |

FOREIGN PATENT DOCUMENTS

| | | |
|---|---|---|
| EP | 0 606 725 A1 | 7/1994 |
| EP | 0 872 748 A2 | 10/1998 |
| WO | WO 99/01562 | 1/1999 |

OTHER PUBLICATIONS

Patent Abstracts of Japan, vol. 1999, No. 09, Jul. 30, 1999 & JP 11 101928A (Toshiba Corp), Apr. 13, 1999, abstract.

* cited by examiner

Primary Examiner—Mark Tremblay
(74) Attorney, Agent, or Firm—Fish & Richardson P.C.

(57) ABSTRACT

The disclosure relates to encapsulated optical fiber end-coupled devices. An optical assembly may include a fiber holder and a cap with an optical component mounted to its underside. The optical component may be aligned with a fiber passing between a substrate and a second section of the fiber holder to allow optical signals to be coupled between the optical component and the fiber. Techniques for assembling the fiber holder and the cap may facilitate the formation of hermetic seals to provide a protective environment for the optical component.

36 Claims, 19 Drawing Sheets

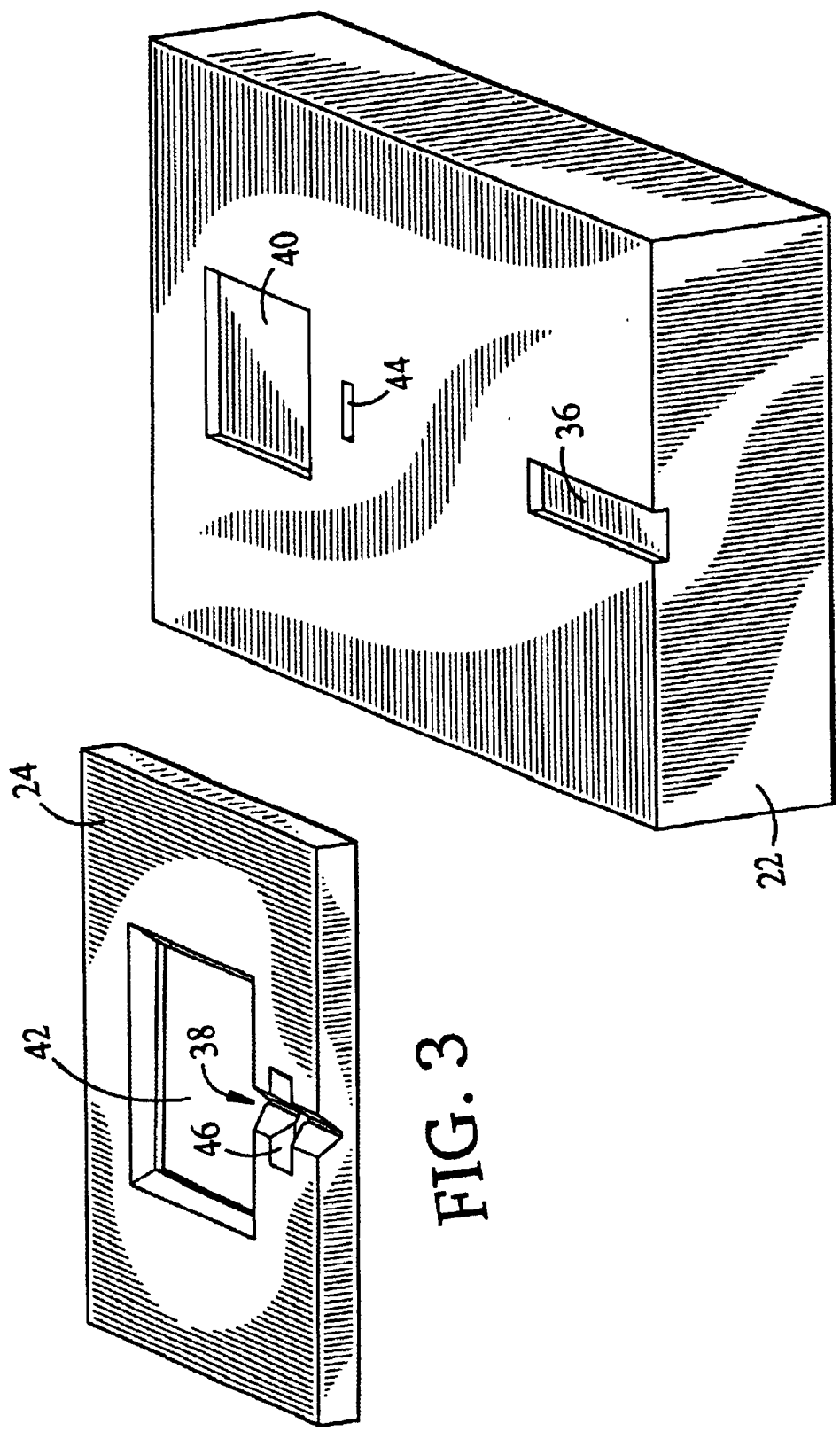

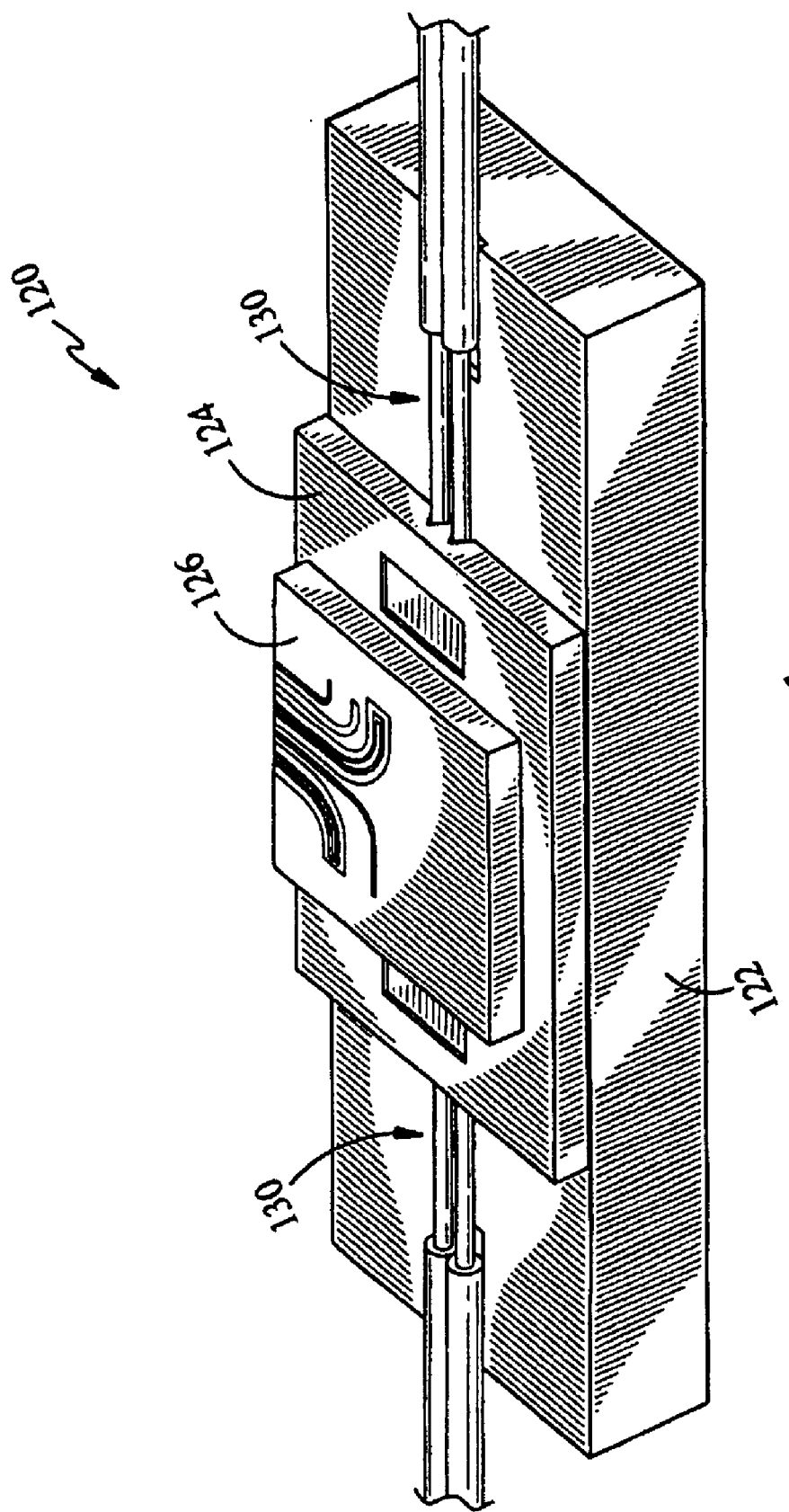

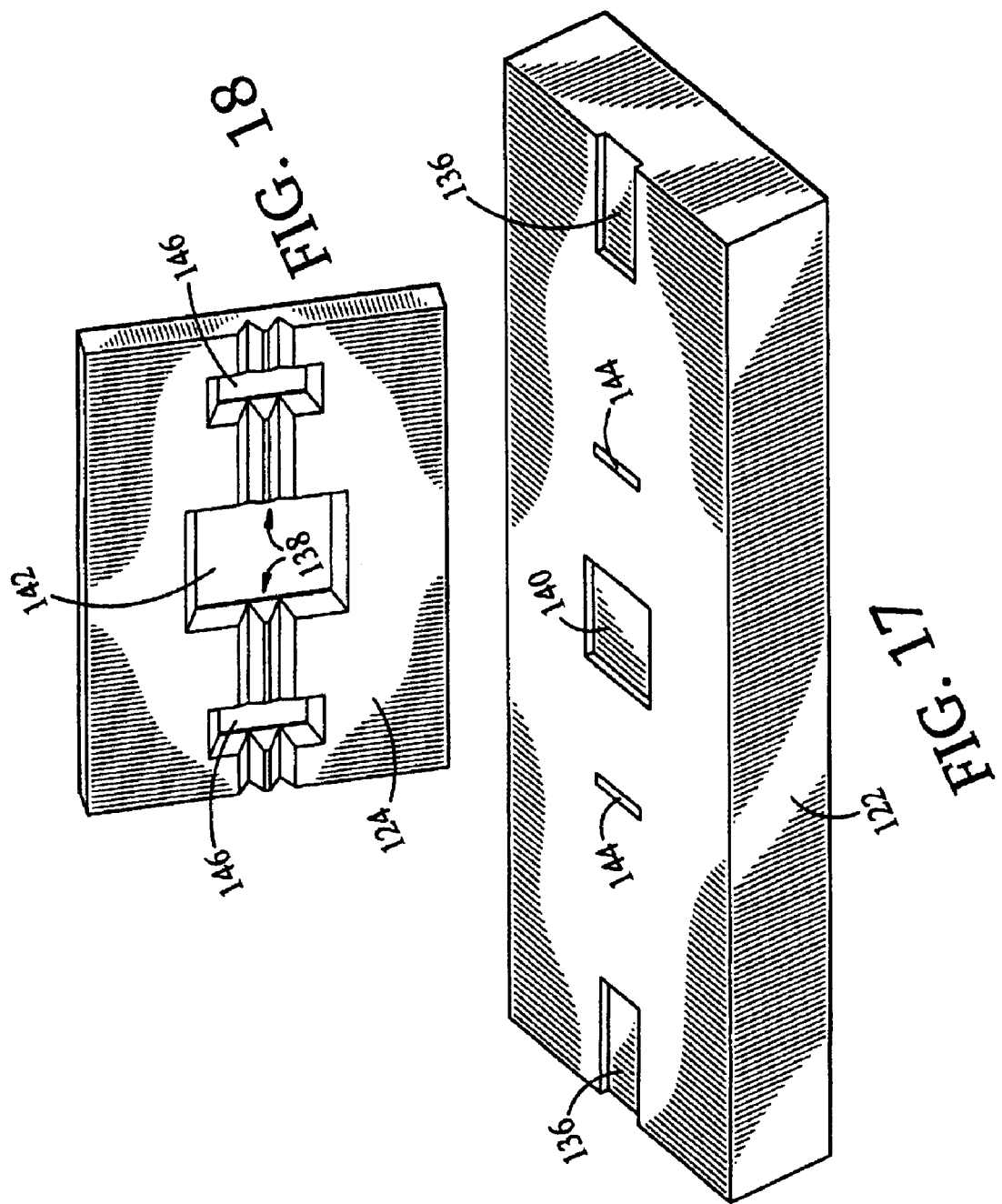

ENCAPSULATED OPTICAL FIBER END-COUPLED DEVICE

BACKGROUND

The present disclosure relates to encapsulated optical fiber end-coupled devices.

Equipment used in the field of optical communications includes assemblies of optical components that may be used in optical fiber networks. The optical components in the assembly may include, for example, an active device, such as a semiconductor laser, and an optical fiber to receive output signals from the laser. To maintain the reliability of such an assembly, the semiconductor laser and optical fiber need to be aligned and firmly fixed in position. Electrical contacts may need to be provided to the components within the assembly. Additionally, it often is desirable to protect the assembly from environmental elements that may deteriorate performance of the optical devices.

BRIEF DESCRIPTION OF THE DRAWINGS

FIG. 2 illustrates a substrate of a fiber holder for the assembly of FIG. 1.

FIG. 3 illustrates a second section of the fiber holder for the assembly of FIG. 1.

FIG. 16 illustrates a sealed assembly for a multi-fiber implementation.

FIG. 17 illustrates a substrate of a fiber holder for the assembly of FIG. 16.

FIG. 18 illustrates a second section of the fiber holder for the assembly of FIG. 16.

SUMMARY

Figure 1:
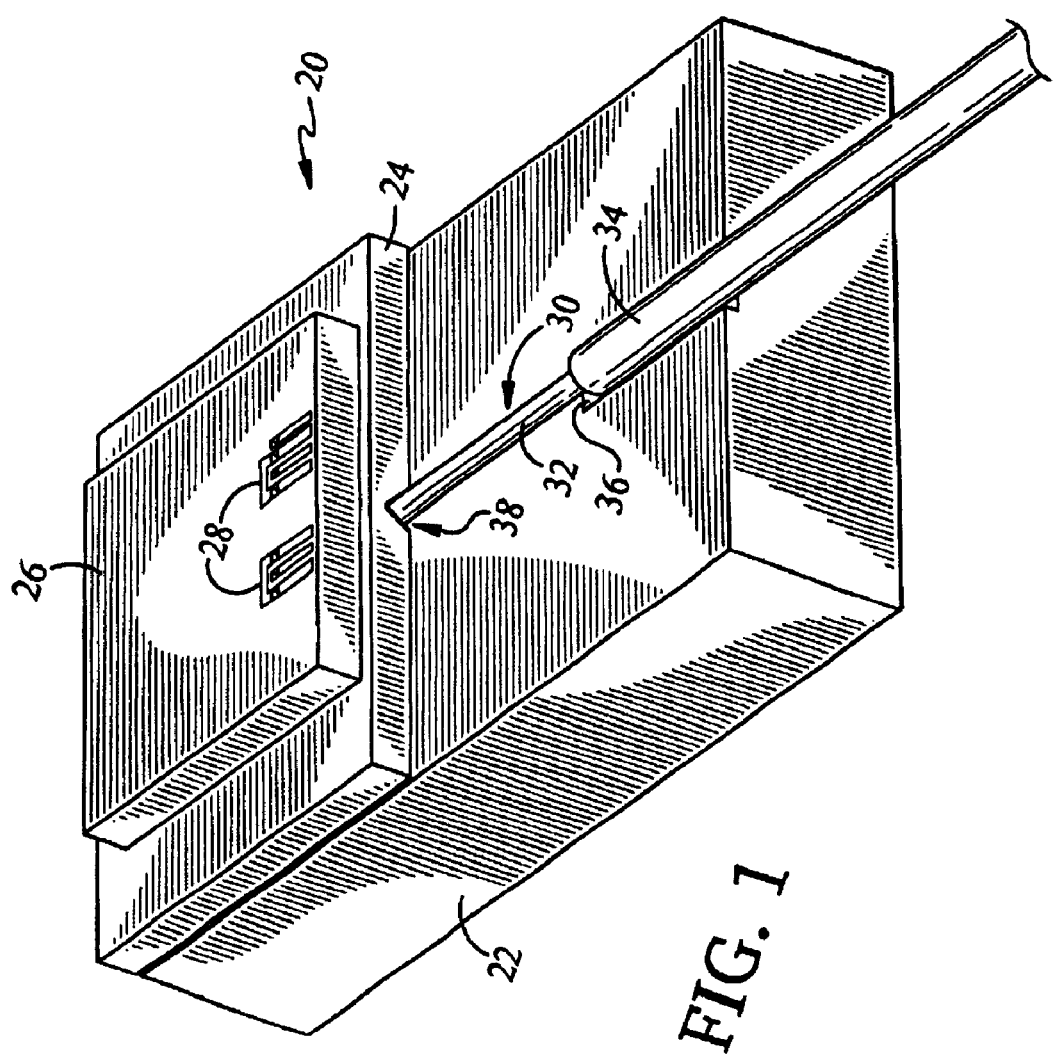
FIG. 1 illustrates a sealed assembly for a single fiber implementation.

The disclosure relates to encapsulated optical fiber end-coupled devices.

An optical assembly includes a fiber holder and a cap with an optical component mounted to its underside. The optical component may be aligned with a fiber passing between a substrate and a second section of the fiber holder to allow optical signals to be coupled between the optical component and the fiber. In some implementations, techniques for assembling the fiber holder and the cap may facilitate the formation of hermetic seals to provide a protective environment for the optical component.

According to one aspect, an apparatus comprises an optical fiber holder and a cap. The fiber holder includes a substrate and a second section attached to the substrate. The cap is attached to the second section of the optical fiber holder such that the second section of the fiber holder is disposed between the cap and the substrate.

A recess in the substrate, an inner surface of an opening in the second section and the underside of the cap define an interior region. An optical fiber, mounted to the substrate, passes between the substrate and the second section to the interior region. The cap may include a conductive through-hole to provide an electrical connection from outside the interior region to the underside of the cap. An optical component, mounted to the underside of the cap and in electrical contact with the conductive through-hole, is positioned with respect to the optical fiber to allow an optical signal to be coupled between the optical fiber and the optical component.

In some implementations, one or more of the following features may be present. For example, the optical component may be hermetically encapsulated within the interior region. A hermetic seal may be provided at a location where the fiber passes between the substrate and the second section. A heretic seal also may be provided at the conductive through-hole in the cap.

The optical component may include one or more opto-electronic devices. Examples of such devices include a light emitting device, a semiconductor laser chip, a light detector, an optical modulator or optical amplifier.

Some implementations may include multiple optical fibers aligned with an opto-electronic device mounted to the cap and located within the interior region of the assembly.

According to another aspect, a method includes positioning an optical fiber on a substrate with the an end of the optical fiber extending to an area defined by a recess in a first surface of the substrate. A second section is fixed to the First surface of the substrate so that a portion of the fiber passes between the substrate and the second section. A material, for example, a solder, an adhesive or a polymer, may be provided through a hole in the second section to fix the fiber in place. The hole is located adjacent the portion of the fiber passing between the substrate and the second section.

The method includes positioning a cap on the second section so that the second section is disposed between the substrate and the cap. The cap includes an optical component mounted to its underside and, when the cap is positioned on the second section, the optical component is encapsulated within an interior region defined by the recess in the substrate, an inner surface of an opening in the second section, and the underside of the cap. The cap may be fixed to the second section with the optical component aligned with the optical fiber to allow an optical signal to be coupled between the fiber and the optical component.

Various implementations may include one or more of the following advantages. The assembly may provide efficient coupling between one or more fibers and an encapsulated optical device. The assembly also may provide long-term stability by encapsulating the active devices in a controlled, hermetic environment. Some implementations may be particularly advantageous for high frequency or high current applications. The assembly also may facilitate the testing of optical devices.

Other features and advantages will be readily apparent from the following detailed description, the accompanying drawings and the claims.

Detailed Description

As shown in FIG. 1, an optical assembly 20 includes a fiber holder comprising first and second sections 22, 24 to hold an optical fiber 30 in place. The first section 22 serves as a substrate to mount the optical fiber. One or more optical components (not shown in FIG. 1) may be housed within an interior region of the assembly and may be optically coupled to the end of the fiber extending to the assembly's interior region. The optical components may include pure optical, opto-electronic or opto-mechanical devices. The optical component(s) may be hermetically sealed within the housing. As discussed below, the optical component(s) (not shown in FIG. 1) may be mounted to the underside of a cap 26, or lid, which may provide an airtight, hermetic seal. The second section 24 of the fiber-holder is sandwiched between the fiber mounting substrate 22 and the cap 26.

If the optical fiber includes a polymer or similar coating, the coating along the portion 32 of the fiber near the interior of the assembly may be removed. A groove 36 may be provided near the edge of the fiber mounting substrate 22 to accommodate the fiber coating 34 so that the fiber lies substantially flat on the substrate. The second section 24 of the fiber holder may include a V-shaped or other groove 38 to accommodate the section of the fiber 30 that passes between the substrate and second section of the fiber holder and that extends to the interior of the assembly. As explained below, a hermetic seal may be provided in the area where the fiber passes between the substrate and the second section of the fiber holder.

Electrical contacts 28 may be provided on the outer surface of the cap 26. The contacts 28 may be electrically coupled to optical components within the hermetically sealed interior region using conductive through-hole connections that extend from the outer surface of the cap 26 to its underside. The through-holes may form hermetical seals as well.

Further details of the cap 26, the fiber holder substrate 22 and the second section 24 of the fiber holder, as well as the assembly process, are described below.

Referring to FIG. 2, the substrate 22 may be formed, for example, of a transparent material, such as glass. The glass substrate is a poor heat conductor and, therefore, can help reduce overheating of the assembly. Alternatively, other materials, such as silicon, may be used for the substrate. The fiber mounting substrate 22 may have a generally flat, rectangular upper surface. In addition to the groove 36, the substrate 22 includes an indented recess 40 that partially defines the interior region. The recess 40, which may be formed, for example, by etching, is sized so that when the cap is positioned in place, as shown in FIG. 1, the optical components mounted to the underside of the cap fit within the interior region. Preferably, the recess area 40 is sufficiently deep that the optical components do not contact the sides of the recess. The substrate 22 also may include a groove or other recess 44 to receive solder paste to facilitate the formation of a hermetic seal around the circumference of the fiber as discussed below.

Referring to FIG. 3, the second section 24 of the fiber holder may be formed, for example, of single crystal silicon. The second section 24 also may have a generally flat surface. In addition to the groove 38, the second section 24 includes an opening 42 whose inner surface partially defines the interior region of the assembly. A rectangular hole 46 may be formed through the second section 24 substantially perpendicular to the groove 38. The hole 46 extends through the thickness of the second section 24 and serves as an access hole to facilitate the application of solder paste to hold the fiber in place and form a hermetic seal.

Figure 4:
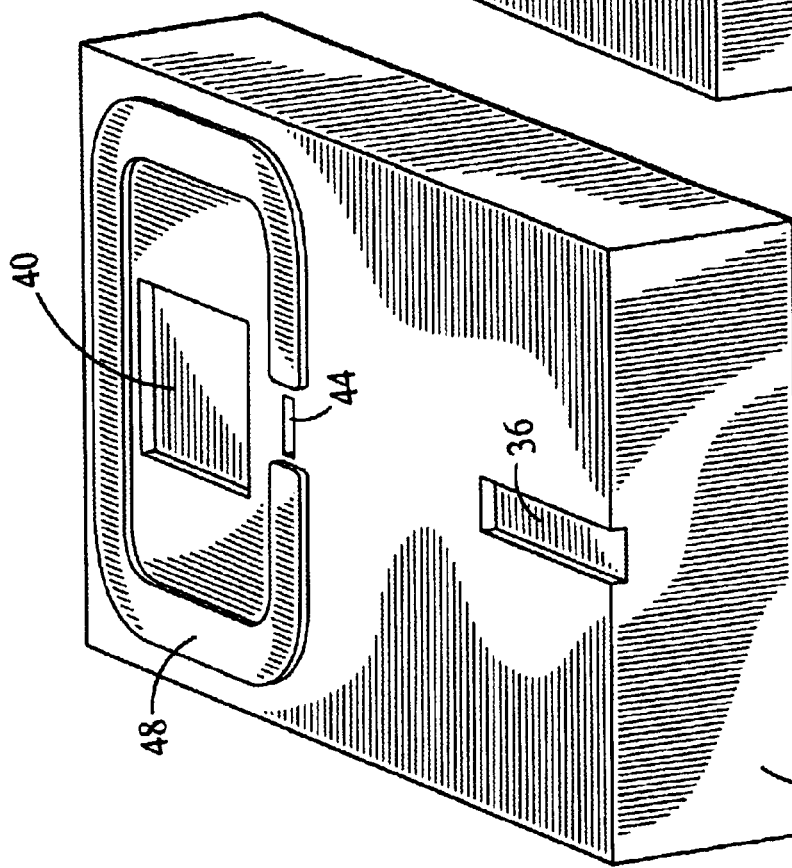

The two sections 22, 24 of the fiber holder may be held together, for example, by a glass solder paste 48 applied to the substrate 22 as illustrated in FIG. 4. The paste may comprise, for example, a dispersion of ground glass solder combined with a binder in a solvent. The glass solder paste may be applied around the recess area 40 by screen printing or precision dispensing. After drying, the glass solder paste may be heated to drive out organics from the binder and to allow the glass particles to fuse together.

If a metal solder is used instead of glass solder, it may be necessary to metallize the surfaces prior to soldering. Thin layers of metals may be evaporated successively prior to applying the metal solder. For example, a layer of titanium may be provided for adhesion, and a layer of platinum on gold may serve as a diffusion barrier. Selective deposition may be achieved using photolithographic techniques. The metal solder may be applied, for example, by evaporation or by electro-deposit techniques. Alternatively, the metal solder may be dispensed as a paste or metal solder pre-form may be used.

Figure 5:
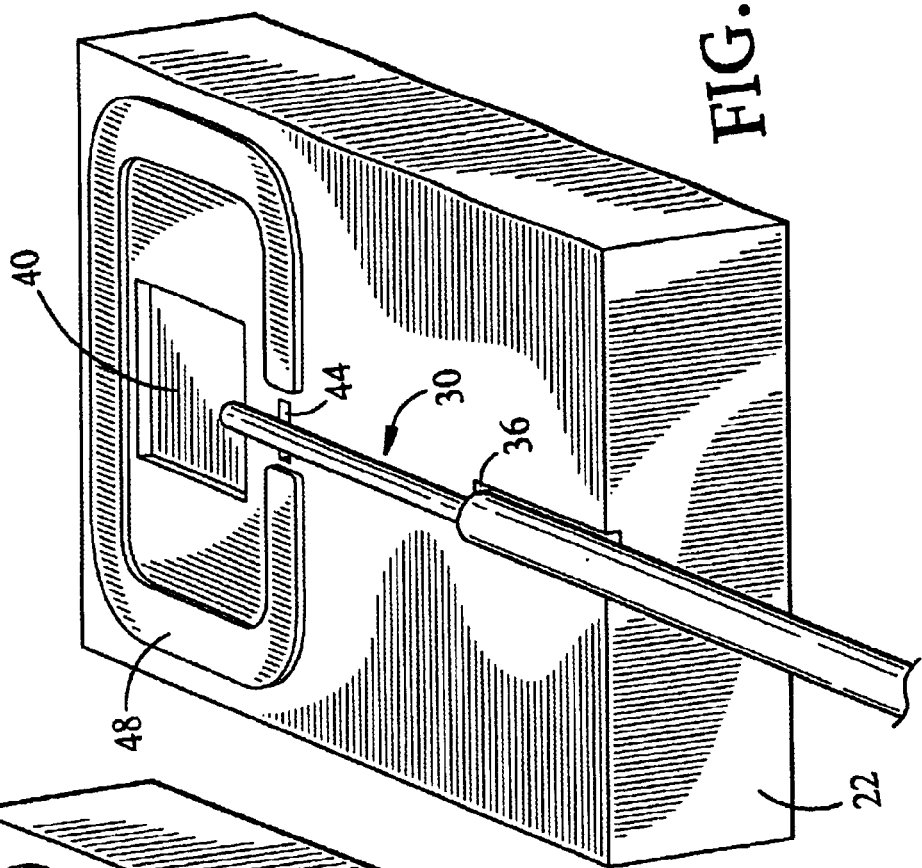
FIGS. 4–6 illustrate steps in the process for assembling the fiber holder.

Before fusing the two sections of the fiber holder together, the optical fiber 30 may be positioned in place as shown in FIG. 5. The fiber extends across the groove 44 with one end of the fiber extending to the recess 40 in the surface of the substrate 22.

Figure 6:
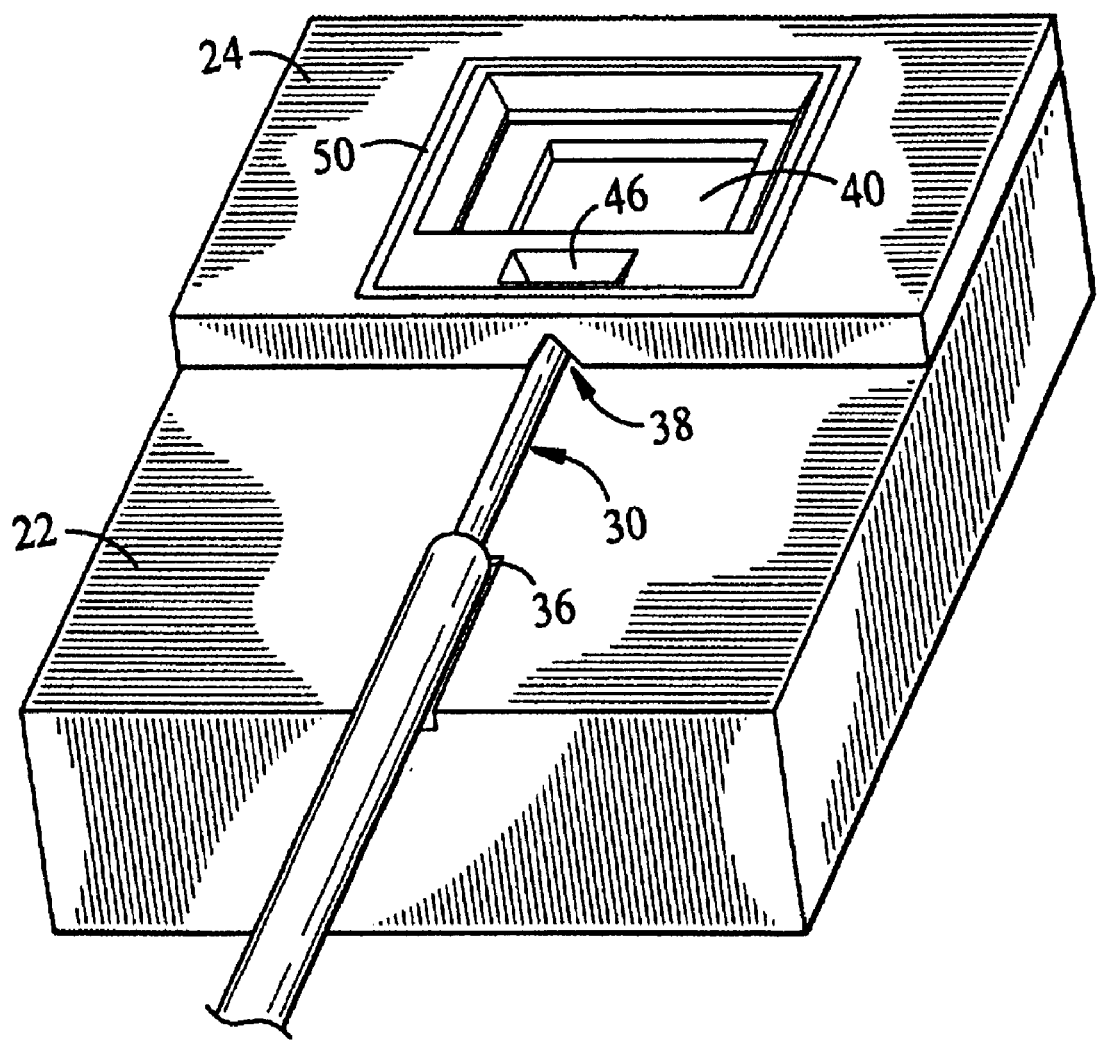

Once the fiber 30 is positioned in place, the second section 24 of the fiber holder may be placed over the substrate 42 as illustrated in FIG. 6. When properly positioned, the opening 46 in the second section 24 is located above the opening 44 in the substrate 22 (FIG. 5). The sections of the fiber holder may be heated while pressing the two sections to fuse them together. The sealing around the circumference of the fiber can be improved by providing additional solder through the opening 46. Sufficient solder may be added so that, upon further heating, it flows around the circumference of the fiber to at least partially or substantially fill the openings 44, 46 so as to fix the fiber in place and provide a hermetic seal at a location where the fiber passes between the substrate and second section of the fiber holder. This technique can allow the functions of fixing the fiber in place and forming a hermetic seal to be performed at the same time. That may reduce the number of steps required for assembly and may reduce the overall size of the package.

In some cases, such as where the fiber is to be used as part of a Bragg grating, heating at temperatures required to melt the solder may cause the fiber to deteriorate. In that case, adhesives or polymers may be used instead of the solder 48. The adhesive may be cured by ultra-violet (UV) light through the transparent glass section 22. The use of adhesives, however, may result in a non-hermetic seal.

After the two sections 22, 24 of the fiber holder are assembled, glue or some other adhesive may be applied in the area between the groove 36 and the section 34 of the fiber 30 to help hold the fiber in place and to provide strain relief for the uncoated brittle section of the fiber 32. If desired, that section of the fiber also may be covered by glue.

As shown in FIG. 6, a metallization ring 50, formed by photoresist masking and the evaporation of suitable metals as previously described, may be provided on the second section 24 of the fiber holder to solder the cap to the fiber holder sub-assembly during subsequent assembly.

Figure 7:
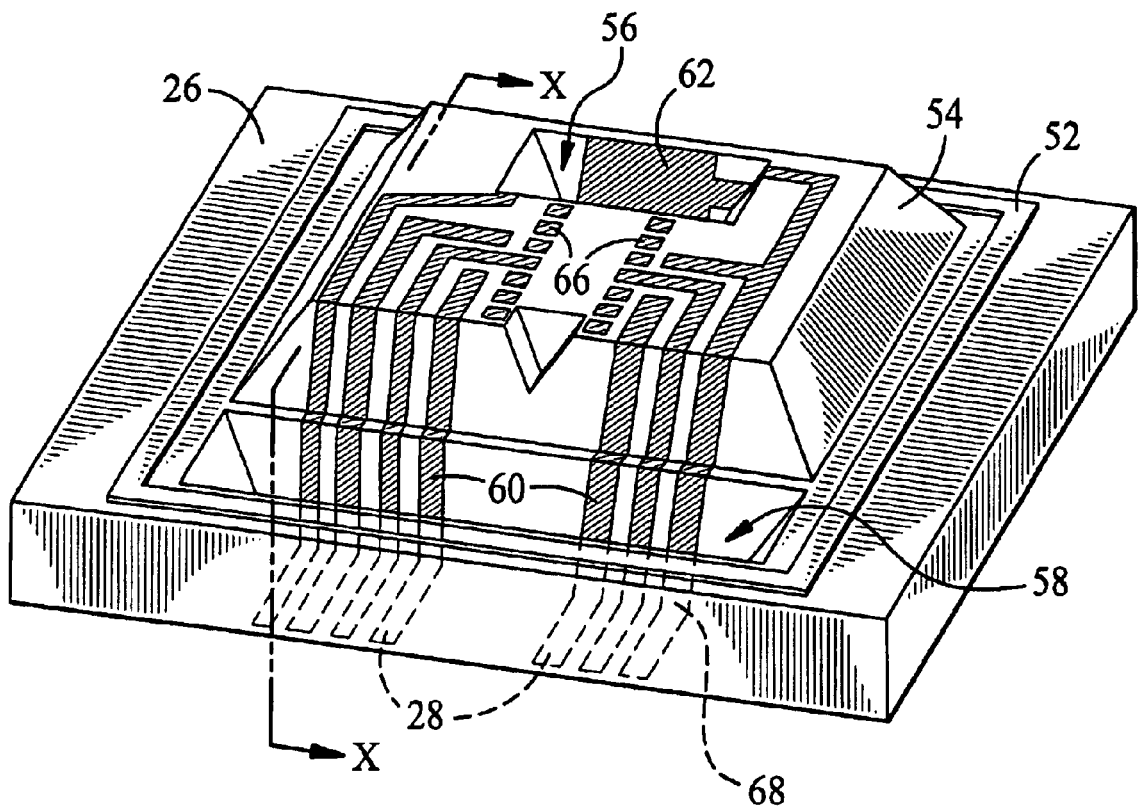
FIG. 7 illustrates an example of cap for the assembly of FIG. 1.

FIG. 7 illustrates additional details of the underside of the cap 26 according to one implementation. The underside may include an island 54. When the cap 26, which may be formed, for example, from a monolithic piece of silicon, is positioned over the upper section 24 of the fiber holder (as in FIG. 1), the island 54 extends into the sealed interior region of the assembly. One or more electronic or optical devices may be mounted to the underside of the cap. Various conductive contacts 66 and lines 60 may be provided on the underside of the cap. The conductive contacts 66 may be connected to the through-hole connections 68, which, in turn, are connected to the electrical contacts 28 on the opposite (external) surface of the cap.

Various techniques may be used to form the hermetically sealed through-hole connections 68. One such technique uses a multilayer structure that includes a substantially etch-resistant layer sandwiched between first and second semiconductor layers. The first and second semiconductor layers may include, for example, silicon, and the etch-resistant layer may include, for example, silicon nitride, silicon oxy-nitride, silicon dioxide. The through-holes may be formed using a double-sided etching process in which the first and second layers are etched until the etch-resistant layer is exposed to define the locations of the through-holes. The semiconductor layer that is intended to be on the underside of the cap 26 may be etched over an area that corresponds to the positions of all or a large number of the through-holes. The through-holes then may be formed by removing part of the etch-resistant layer. Such etching may result in the opening 58 in FIG. 7.

The through-holes may be hermetically sealed, for example, using all electro-plated feed-through metallization process as the base for the through-hole connections. The feed-through metallization also may include a diffusion barrier, and the sealing material may include, for example, a non-noble metal.

Figure 8:
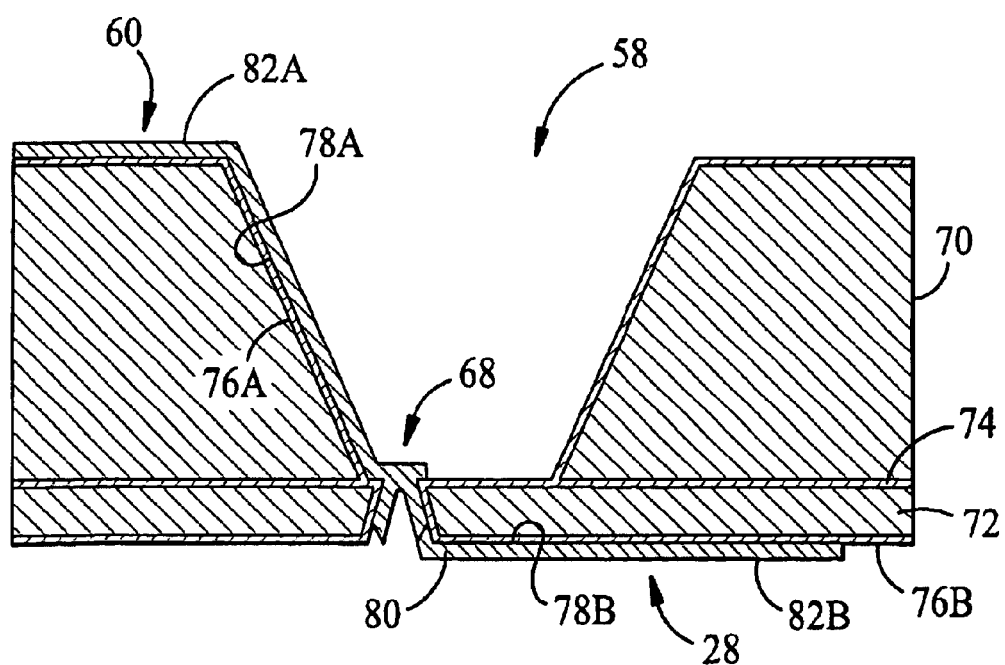
FIG. 8 is a cross-section of FIG. 7 taken along lines X—X.

FIG. 8 illustrates a cross-section of the opening 58 and one of the through-hole connections 68 taken along the lines X—X in FIG. 7. The etch-resistance layer 74 is located between the first and second semiconductor layers 70, 72, a dielectric layer 76A, 76B, such as a thermal silicon dioxide layer, may be present over the surfaces of the First and second semiconductor layers 70, 72. An adhesion layer 78A, 78B may serve as an electroplating base on which the feed-through metallization layer 80 is formed. The metallization layer 80 also may form the contacts 60 and 28. A combined diffusion and wetting layers 82A, 82B may be present over the surface of the metallization 80. An anti-oxidation layer may be formed over the layers 82A, 82B. Other techniques may be used to form the through-hole connections 68 as well.

In the particular implementation illustrated in FIG. 7, the contacts 66 are positioned for mounting a semiconductor laser, and another recess 56 is provided on the underside of the cap to hold a monitor diode. Conductive contacts 62, 64 may be provided along walls of the recess 56 so that electrical signals are provided to and from the monitor diode. Other optical, electronic and optoelectronic components, Such as lenses, optical isolators, integrated circuits, capacitors, and inductors, among others, may be mounted to the underside of the cap as well.

Figure 9:
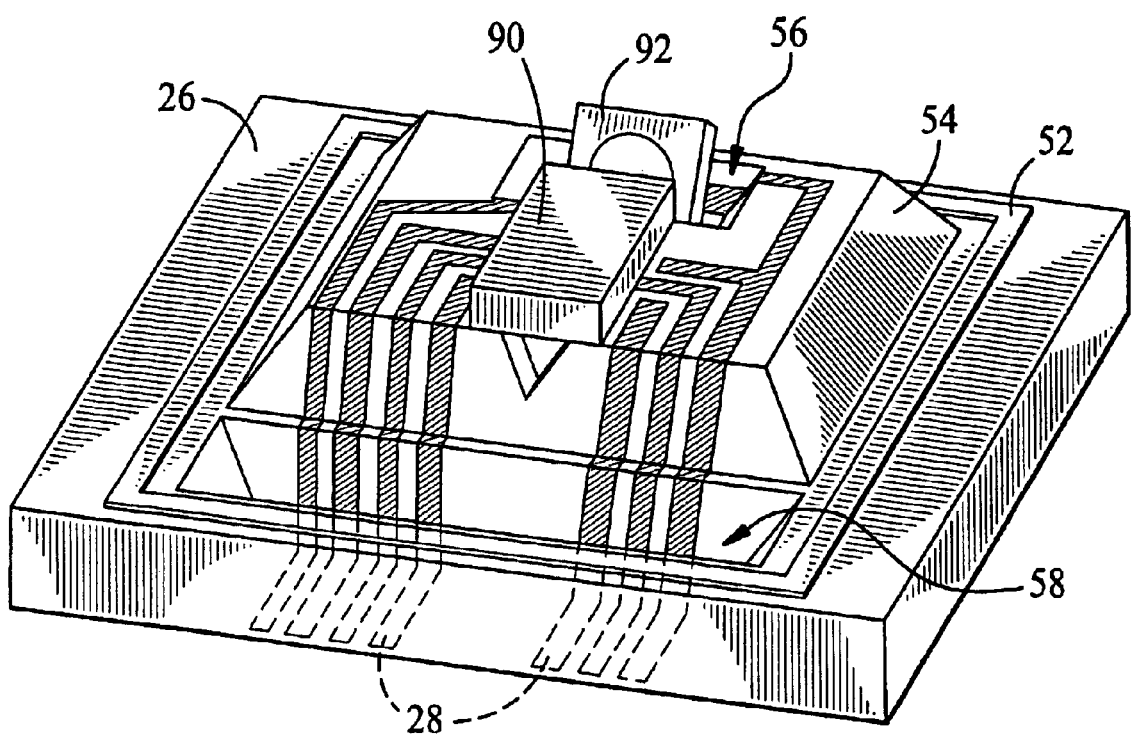
FIG. 9 illustrates optical components mounted to the cap of FIG. 7.

FIG. 9 illustrates a semiconductor laser chip 90 and monitor diode 92 mounted to the underside of the cap 26. In this example, the laser chip is mounted with its active side on the cap and its electrical contacts (not shown) on the active side. Such an arrangement may be particularly useful for lasers or other components using high frequency signals which may not be well-suited for transmission through wires. The arrangement also may facilitate accurate vertical positioning of the light beam from the laser chip relative to the surface of the cap. The monitor diode 92 may be mounted in the recess 56 and can monitor light emitted through the backside of the semiconductor laser chip 90.

Figure 12:
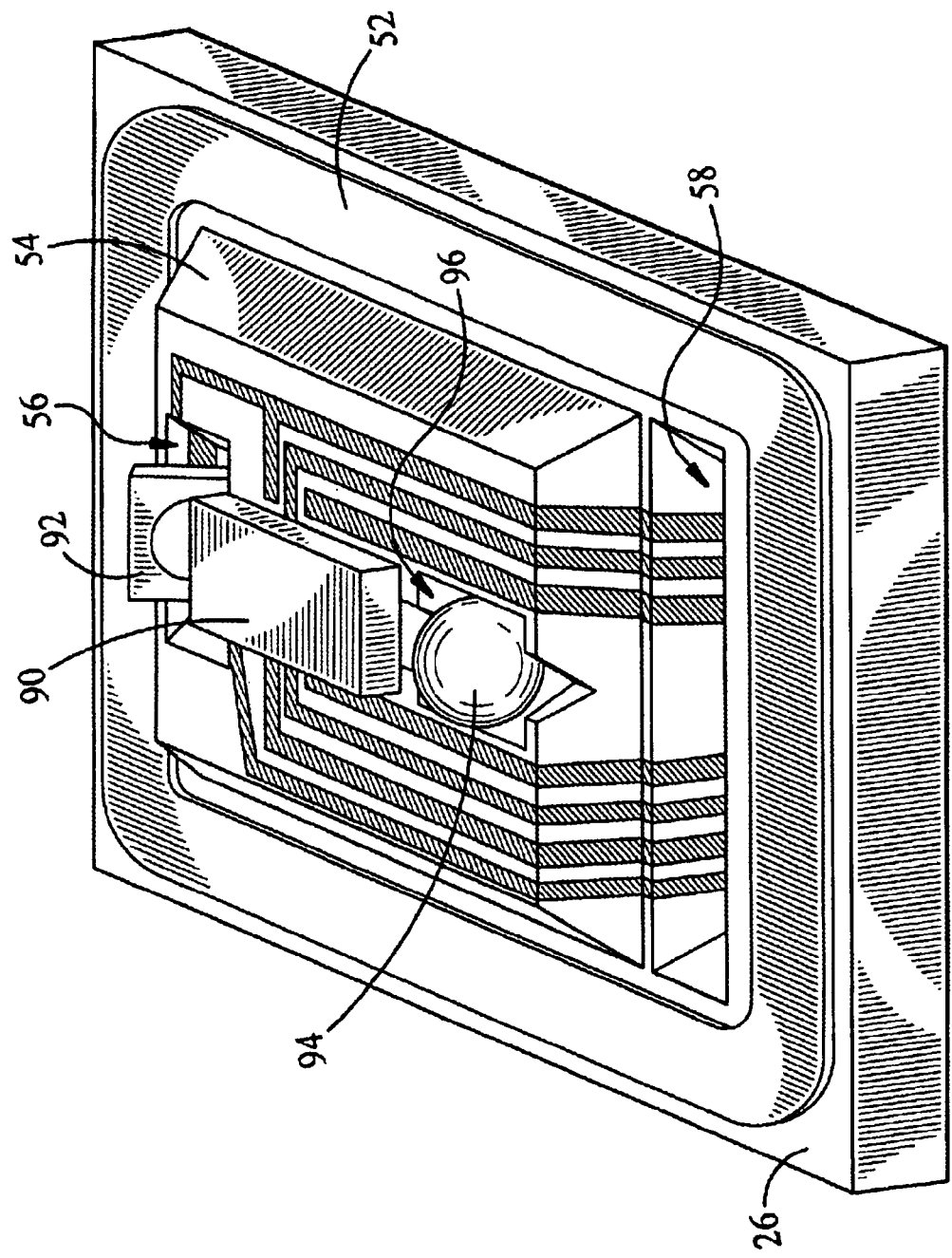
FIGS. 12–14 illustrate alternative implementations for the cap and for mounting optical components to the cap.
Figure 13:
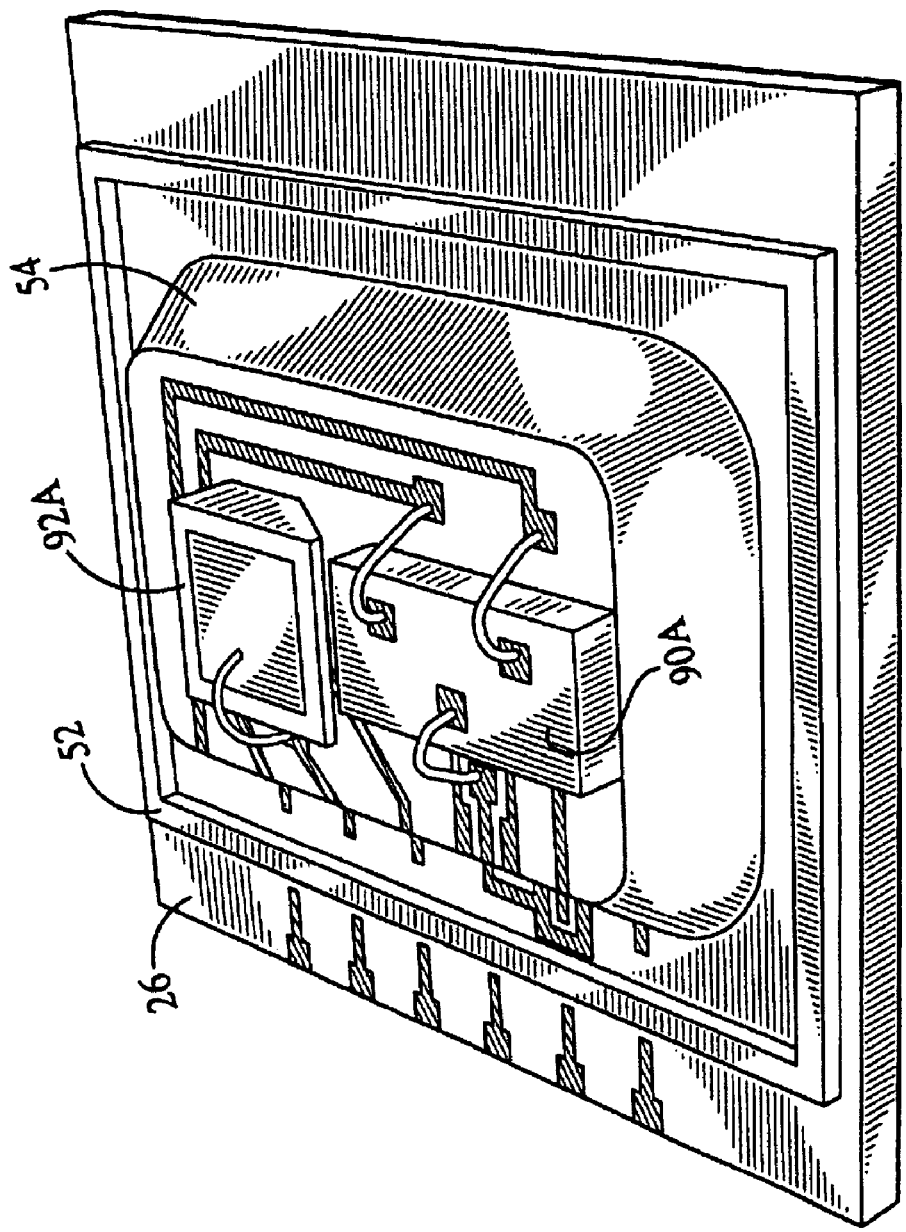

As previously mentioned, additional or other active and passive devices may be mounted to the cap as well. For example, as illustrated in FIG. 12, an optical lens 94 may be positioned in another recess 96 provided in the island 54 on the underside of the cap 26. In other implementations, as illustrated for example in FIG. 13, the laser chip 90A may be mounted to the island 54 with its active side up. Electrical contact may be provided through wires and leads to the top and underside of the laser chip, and a diode 92A may be provided to monitor the light from the backside of the laser chip.

Figure 14:
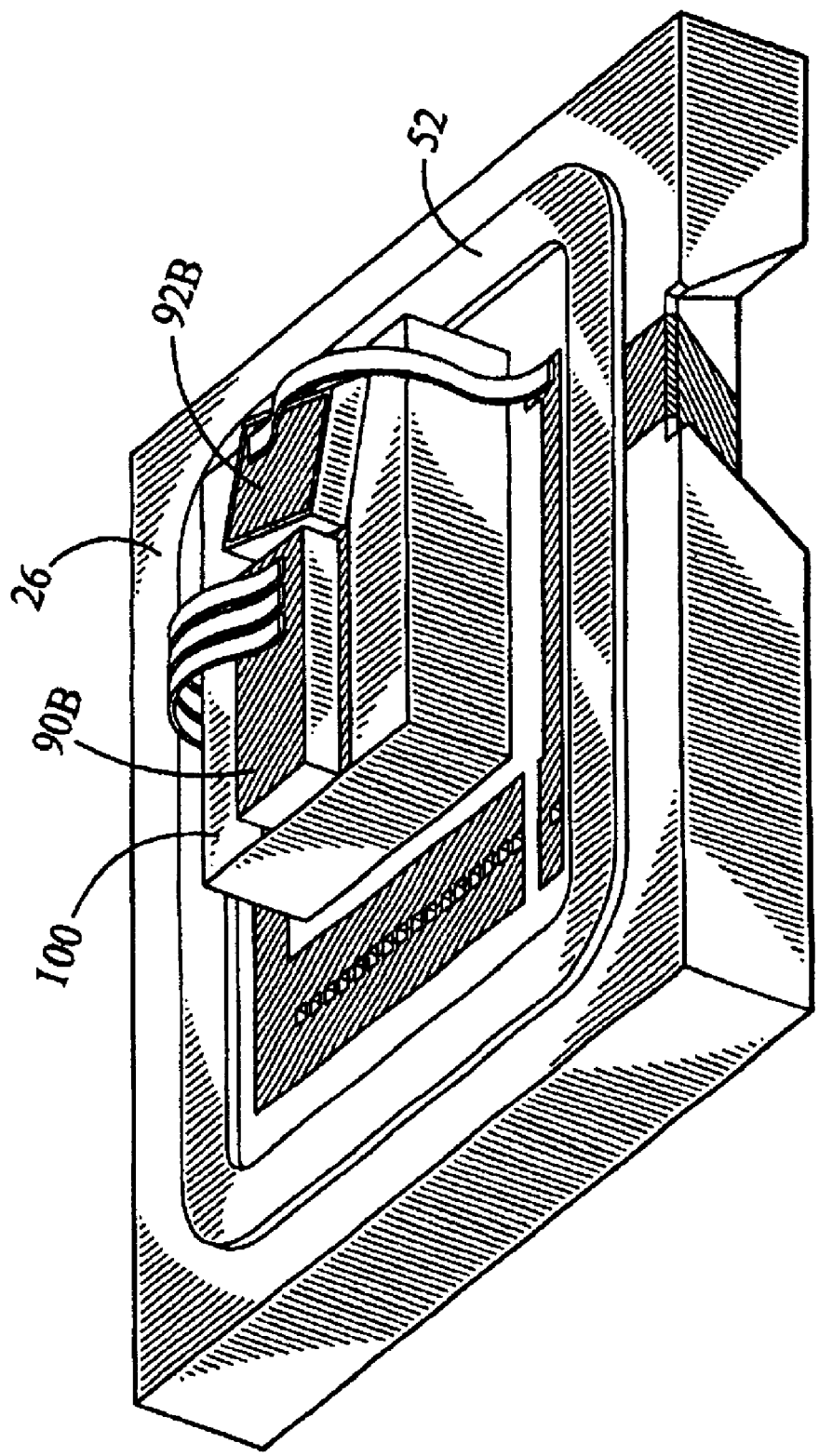

The laser or other devices need not be mounted directly to a monolithic silicon cap. For example, as shown in FIG. 14, the laser chip 90B and monitor diode 92B may be mounted to a diamond submount 100, which in turn is mounted to the silicon cap 26. The diamond submount can provide good heat conduction, which may be particularly useful for high power laser chips.

In other implementations, a light detector, such as a p-i-n diode, may be mounted to the cap to receive optical signals from the fiber 30.

Figure 10:
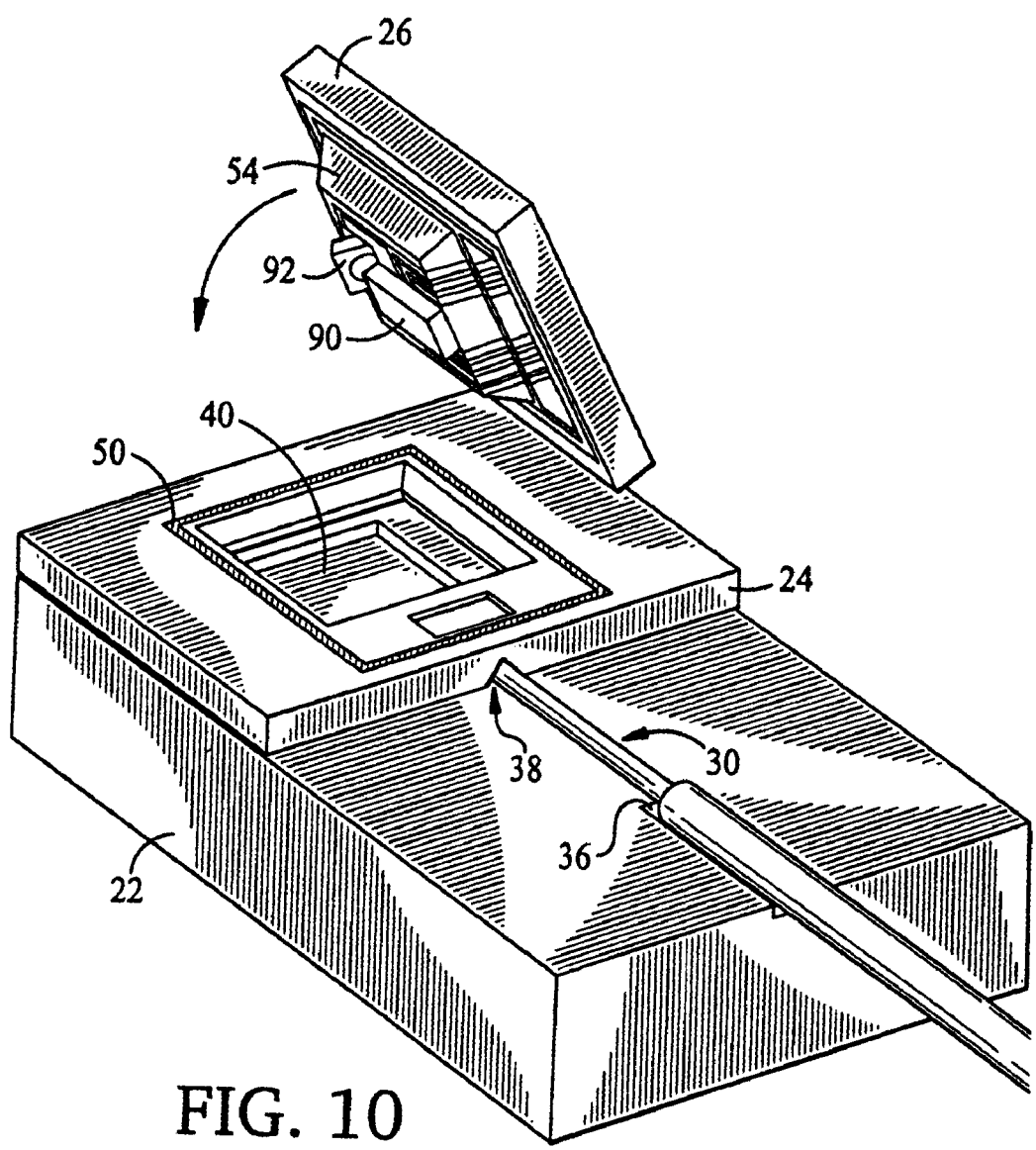
FIGS. 10 and 11 illustrate steps in the process for assembling the cap to the fiber holder.
Figure 11:
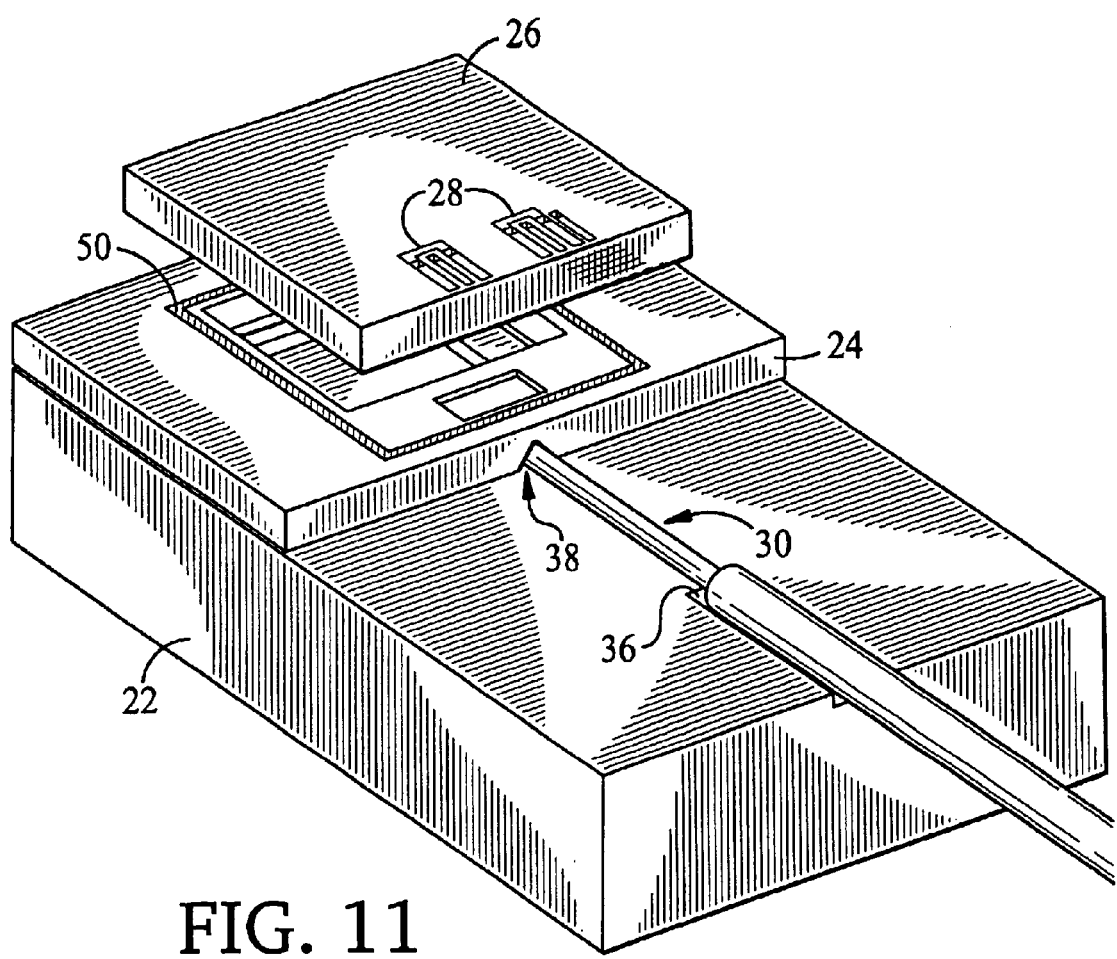

To facilitate attaching the cap 26 to the fiber holder sub-assembly, a metal solder ring 52 may be provided near the periphery of the cap's underside (see FIGS. 7 and 9). A UV-curable adhesive having a small expansion coefficient and low shrinkage during curing also may be applied, for example, near the outer perimeter of the cap. The use of metal solder allows the cap to be fused to the fiber holder sub-assembly at a lower temperature that does not cause the glass solder ring 48 (see FIG. 5) to re-flow. To attach the cap to the fiber-holder sub-assembly, the cap 26 may be rotated as shown in FIGS. 10 and 11 so that the optical components 90, 92 mounted on the island 54 are disposed within the interior region of the assembly defined by the surfaces of the recess area 40 on the substrate 22, the inner sidewalls of the second section 24 and the underside of the cap 26.

Before fixing the cap 26 in place with respect to the fiber holder sub-assembly, tests may be performed to ensure that the output from the front end of the laser chip 90 is properly aligned with the optical fiber 30. For example, electrical signals from the backside of the cap may be provided to the laser chip. The optimal position of the laser may be determined, for example, using an active alignment technique in which the laser is turned on and the optical output from the far end of the fiber is measured. The point at which maximum optical coupling occurs between the fiber and laser chip may be used as the optimal position for the laser chip. Once the optimal position is determined, the cap 26 may be fixed in place, for example, using a two-step process. The position of the cap 26 may be fixed initially by hardening the adhesive such as an UV-curable material. Next, a hermetic seal may be formed between the cap 26 and the upper section 24 of the Fiber holder by re-flowing the metal solder.

In some cases, after determining the optimal position of the laser chip, the cap may be moved back by a predetermined distance. Next, a solder ring may be placed on the second section and melted. The cap then is moved forward to the previously determined optimal position so that metallization on the cap contacts the molten solder. As the solder cools, a seal is formed between the second section of the fiber holder and the cap.

Alternatively, the cap may be fixed in place in a single step by heating the assembly to the soldering temperature while the cap is held in place by a mounting tool. Other techniques may be used to align the optical component with the fiber and to attach the cap to the second section of the fiber holder.

After the cap 26 is attached to the fiber holder sub-assembly, the assembly appears as shown in FIG. 1.

Figure 15:
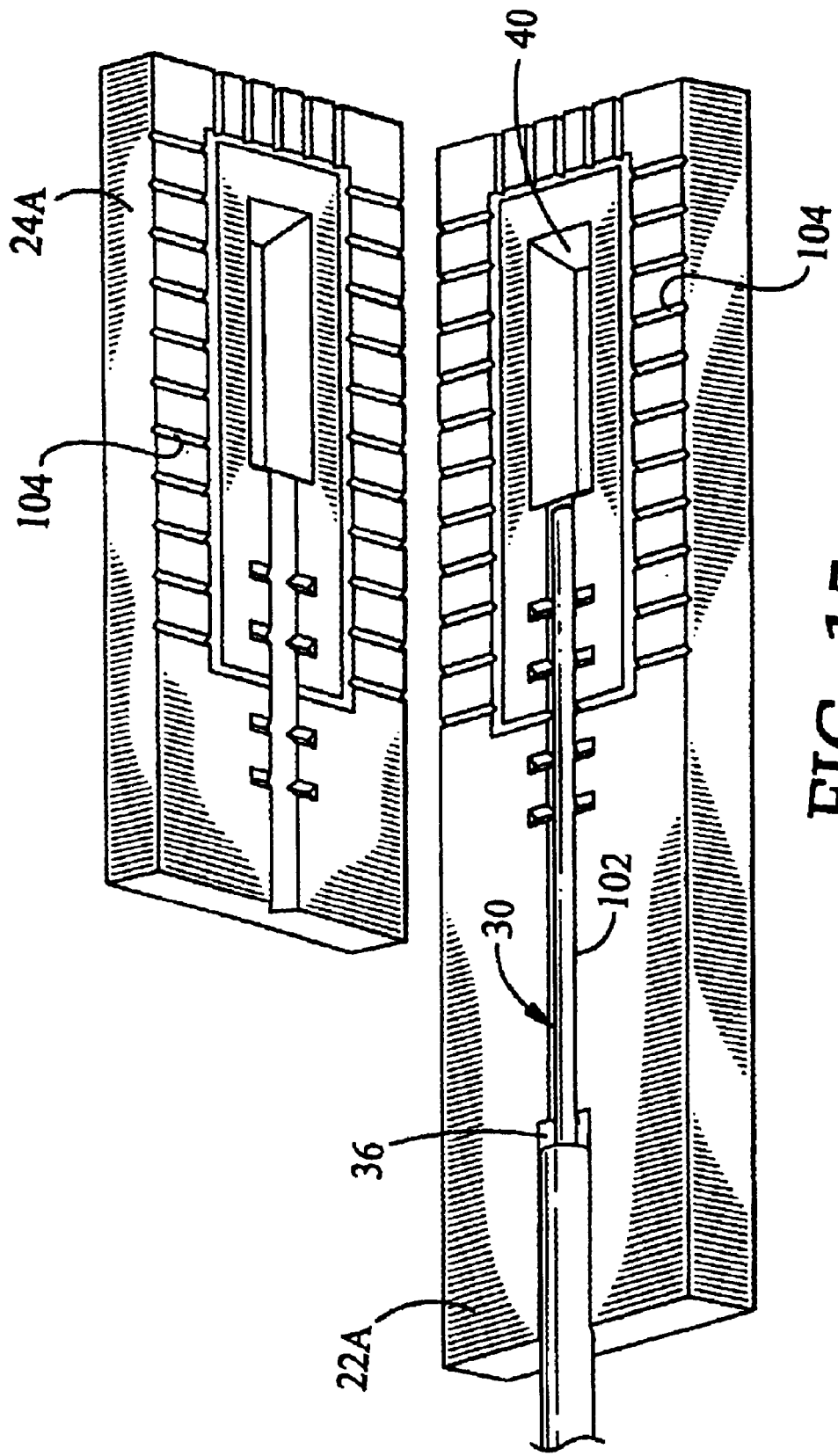
FIG. 15 illustrates another implementation of a fiber holder.

Particular details of the assembly may differ in various implementations, For example, as shown in FIG. 15, the dimensions of the sections 22A, 24A of the fiber holder may differ from those shown in the earlier figures and may be tailored to the particular application. To facilitate positioning of the fiber, a V-shaped or other groove 102 may be provided in the substrate 22 underneath the portion of the fiber from which the coating is removed. Similarly, one or both sections 22, 24 of the fiber holder may include indentations 104 along their periphery into which overflow solder may flow.

FIG. 16 illustrates a sealed assembly 120 that includes multiple fibers 130 that may be optically coupled to one or more devices (not shown in FIG. 16) mounted to the underside of the cap 126. Details of a substrate 122 and second section 124 of a fiber holder are shown in FIGS. 17–18 and may be similar to those for the single fiber implementation(see FIGS. 2 and 3). In this example, the fiber holder is designed to accommodate four fibers—two fibers to direct incoming light to an optical device in the sealed interior region of the assembly, and two fibers to receive light from the device.

The substrate 122 includes a recess 140 that corresponds to the recess 40 in FIG. 2. The function of the recesses 144 and grooves 136 correspond generally to the recess 44 and groove 136 in FIG. 2. Similarly, the second section 124 of the fiber holder includes an opening 142 that corresponds to the opening 42 in FIG. 3. The function of the grooves 138 and openings 146 correspond generally to the groove 38 and opening 46 in FIG. 3.

Figure 19:
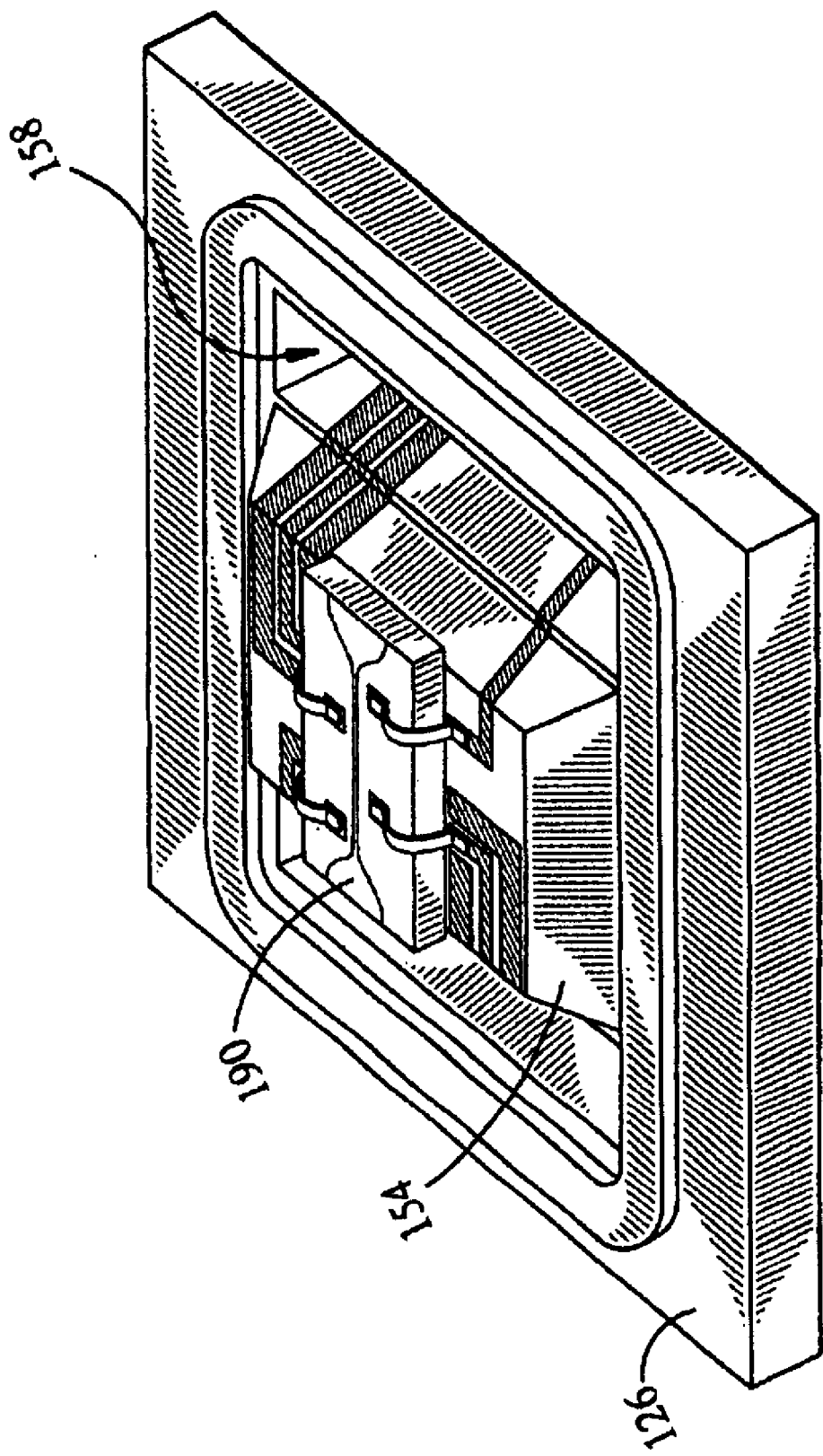
FIG. 19 illustrates a cap and mounted optical component for the assembly of FIG. 16.

Additional details of one implementation of the underside of the cap 126 are illustrated in FIG. 19. The cap may include an island 154 onto which the optical device 190 is mounted. The optical device may be, for example, an optical modulator such as a semiconductor optical amplifier. When the cap is assembled to the fiber holder, the device 190 is aligned with the fibers so that the optical signals to and from the fibers can be optically coupled with the device. As previously discussed, in some implementations the cap may be formed as a monolithic piece. In other implementations, the optical device may be mounted to a diamond or other submount which in turn is mounted to the underside of the cap.

Figure 20:
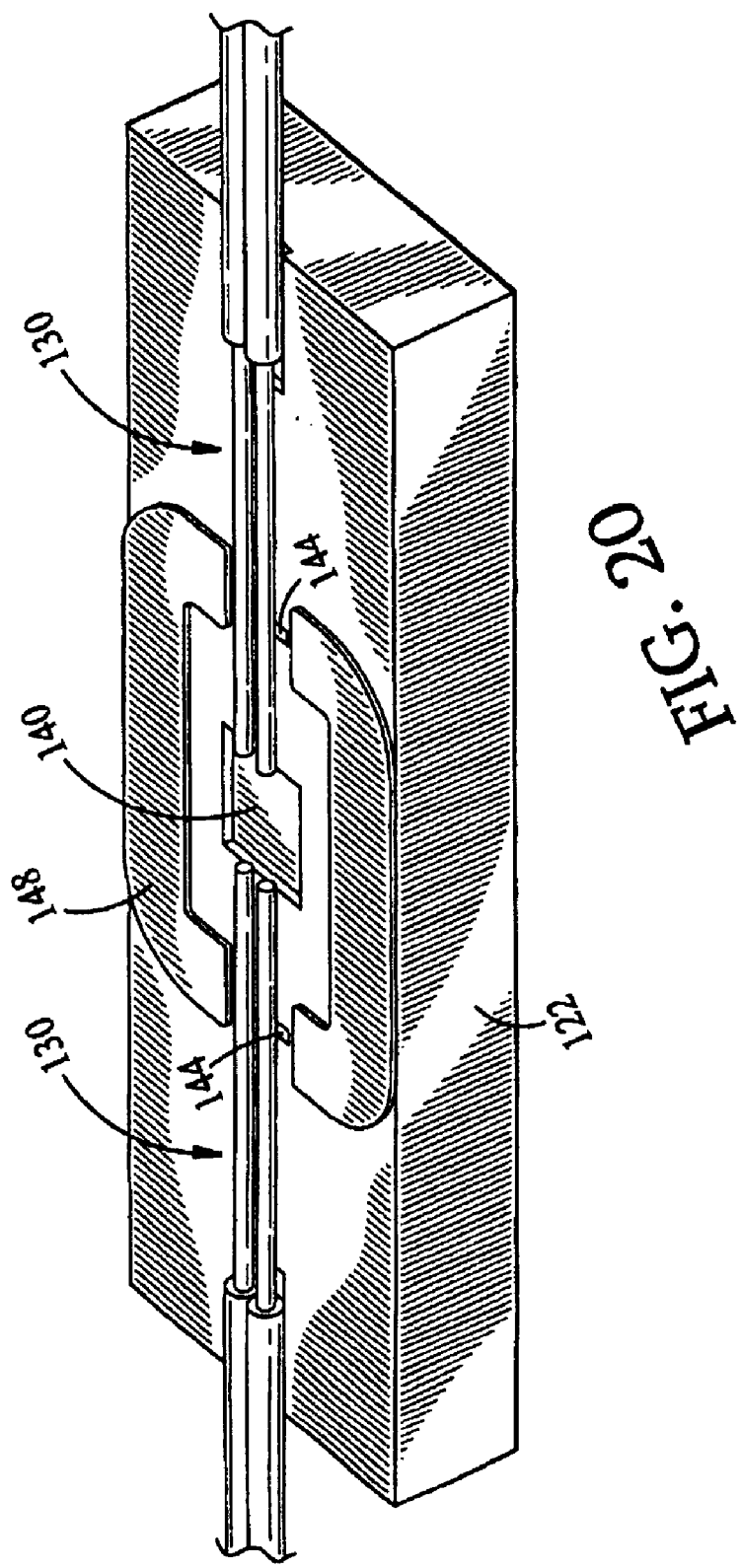
FIGS. 20–23 illustrate steps in a process for assembling the fiber holder and cap for the assembly of FIG. 16.
Figure 21:
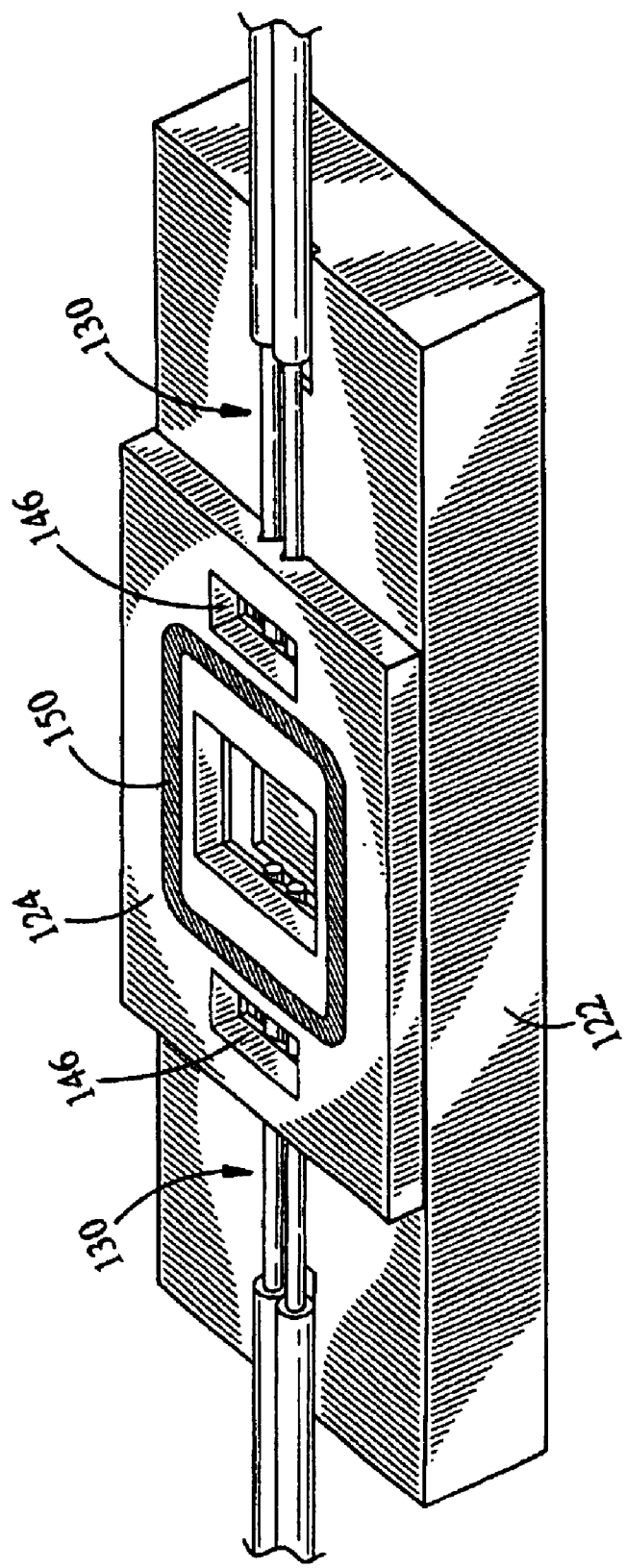
Figure 22:
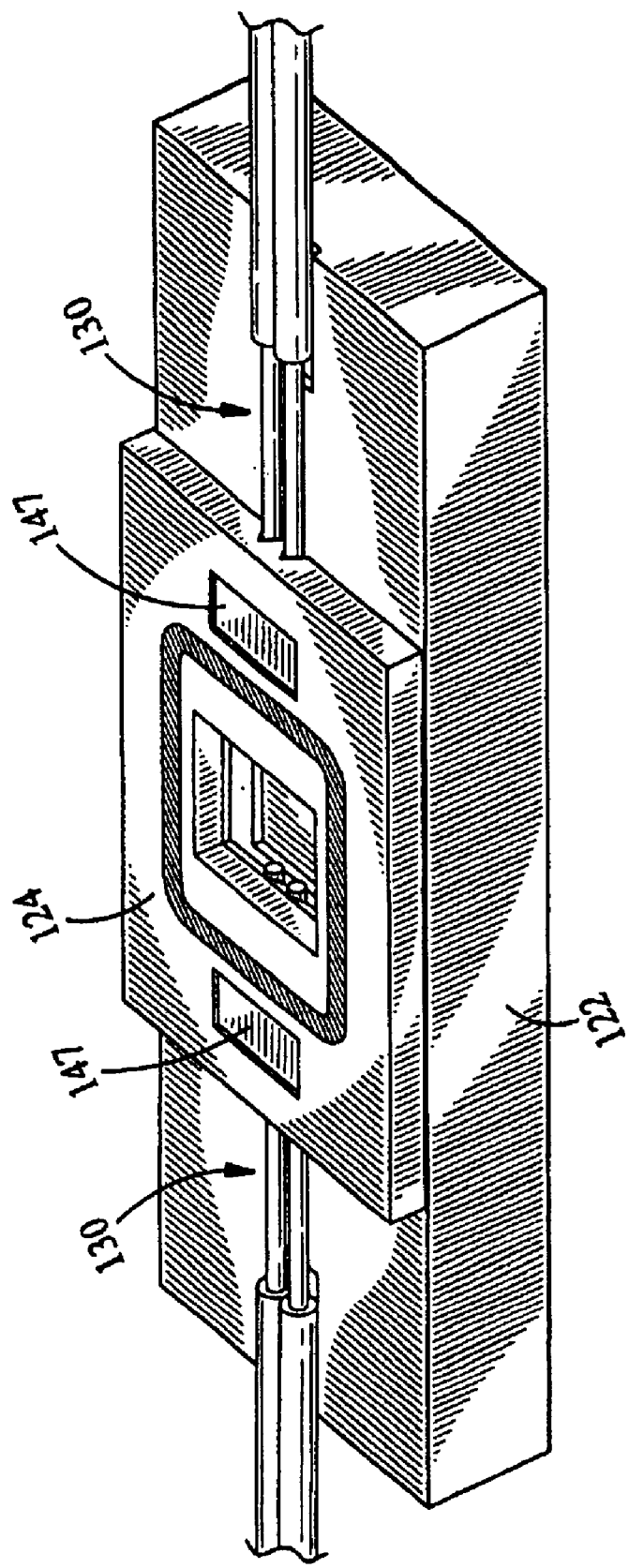
Figure 23:
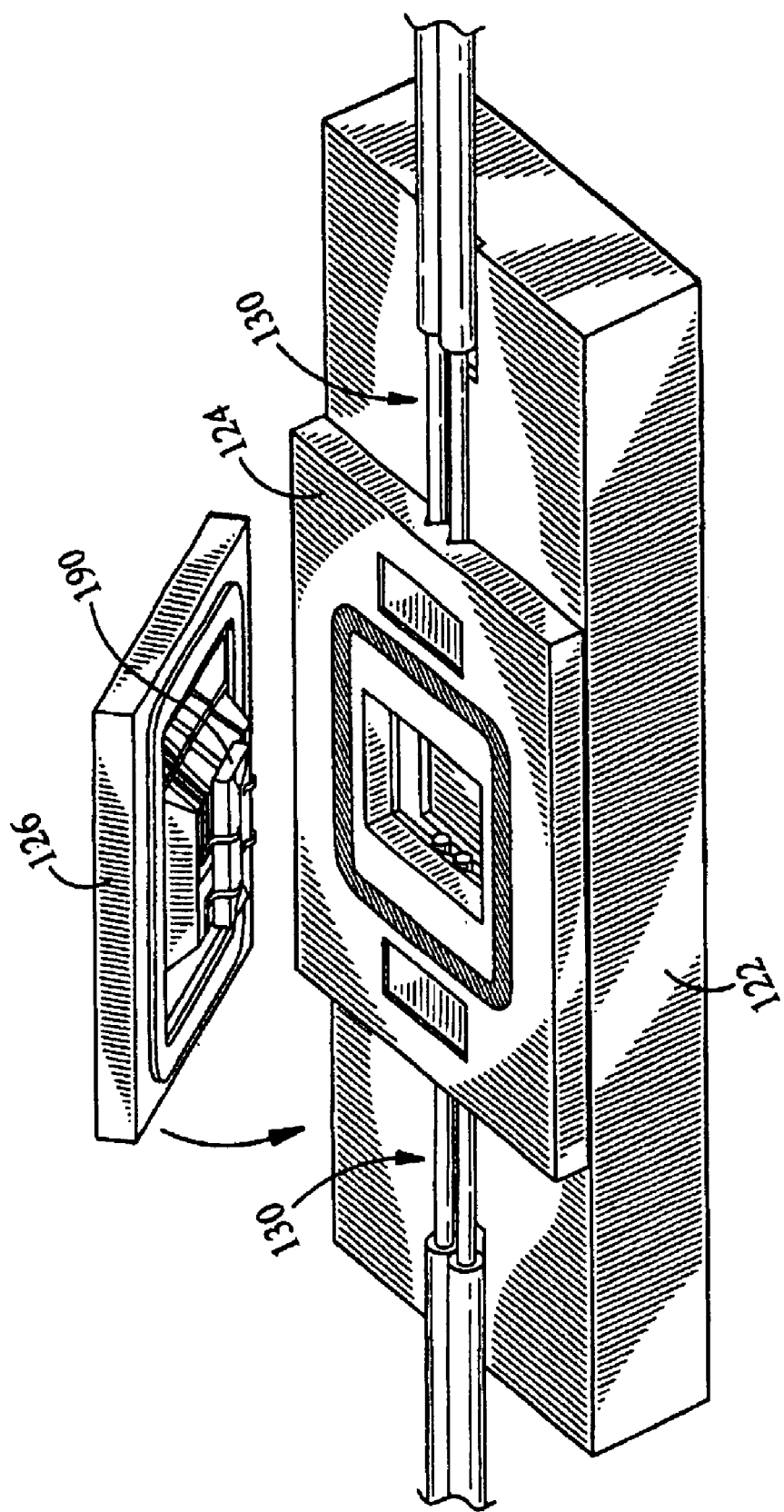

FIGS. 20–23 illustrate additional steps in the assembly process for the multi-fiber implementation. FIG. 20, for example, illustrates initial positioning of the optical fibers 130 and application of glass solder 148 to the substrate 122 to hold together the sections of the fiber holder (see FIG. 21). A solder paste ring 150 may be provided on the second section 124 of the fiber holder to fuse the cap 126 to the fiber holder sub-assembly. As shown in FIG. 22, the openings (146) may be filled with solder 147 to hold the fibers in place and to form hermetic seals where the fibers pass between the substrate 122 and the second section 124 of the fiber holder. The cap 126 then may be assembled to the fiber holder (see FIG. 23) so that the optical device is located within the interior region of the assembly and is aligned with the fibers 130 as illustrated in FIG. 16.

Other implementations are within the scope of the claims.

What is claimed is:

1. An apparatus comprising:
    an optical fiber holder including:
        a substrate with a recess formed in a first surface;
        a second section attached to the first surface of the substrate and including an opening defining an inner surface;
        a cap attached to the second section of the optical fiber holder such that the second section of the fiber holder is disposed between the cap and the substrate, the cap including an underside, wherein the recess in the first surface of the substrate, the inner surface of the opening in the second section and the underside of the cap define an interior region, and wherein the cap includes a conductive through-hole to provide an electrical connection from outside the interior region to the underside of the cap;
    an optical fiber mounted to the substrate and passing between the substrate and the second section to the interior region; and
    an optical component mounted to the underside of the cap and in electrical contact with the conductive through-hole, the optical component being positioned with respect to the optical fiber to allow an optical signal to be coupled between the optical fiber and the optical component.

2. The apparatus of claim 1 including a hermetic seal at a location where the fiber passes between the substrate and the second section of the fiber holder.

3. The apparatus of claim 1 including a hermetic seal at the conductive through-hole in the cap.

4. The apparatus of claim 1 including:
    a hermetic seal at a location where the fiber passes between the substrate and the second section of the fiber holder; and
    a hermetic seal at the conductive through-hole in the cap.

5. The apparatus of claim 1 wherein the optical component is hermetically encapsulated within the interior region.

6. The apparatus of claim 1 wherein the substrate and second section of the fiber holder are held together by solder.

7. The apparatus of claim 6 wherein the solder comprises glass solder.

8. The apparatus of claim 1 wherein the cap and the second section of the fiber holder are held together by solder.

9. The apparatus of claim 1 wherein the optical component comprises an opto-electronic device.

10. The apparatus of claim 1 wherein the optical component includes a light emitting device.

11. The apparatus of claim 1 wherein the optical component comprises a semiconductor laser chip.

12. The apparatus of claim 11 further including a light detector mounted to the cap for monitoring an optical signal from the laser chip.

13. The apparatus of claim 12 wherein the cap includes a recess in which the light detector is mounted.

14. The apparatus of claim 1 wherein the optical component includes a light detector.

15. The apparatus of claim 1 wherein the optical component includes an optical modulator.

16. The apparatus of claim 1 wherein the optical component includes a semiconductor optical amplifier.

17. The apparatus of claim 1 wherein the cap includes an island to which the optical component is mounted.

18. The apparatus of claim 1 wherein the cap includes a submount to which the optical component is mounted.

19. The apparatus of claim 1 further including:
    a second optical fiber mounted to the substrate and passing between the substrate and the second section to the interior region; and
    wherein the optical component is positioned with respect to the second optical fiber to allow an optical signal to be coupled between the second optical fiber and the optical component.

20. The apparatus of claim 19 wherein the optical component includes an optical modulator to receive an optical signal from a first one of the fibers and to transmit an optical signal to a second one of the fibers.

21. The apparatus of claim 20 wherein the optical component includes an optical amplifier.

22. The apparatus of claim 20 wherein the optical component is hermetically encapsulated within the interior region.

23. The apparatus of claim 1 wherein at least one of the substrate and the second section includes a groove to accommodate the fiber.

24. A method comprising:
    positioning an optical fiber on a substrate that includes a recess in a first surface, an end of the optical fiber extending to an area defined by the recess;
    fixing a second section to the substrate so that a portion of the fiber passes between the substrate and the second section;
    providing a material through a hole in the second section to fix the fiber in place, the hole being located adjacent the portion of the fiber passing between the substrate and the second section;
    positioning a cap on the second section so that the second section is disposed between the substrate and the cap, the cap including an optical component mounted to its underside, wherein, when the cap is positioned on the second section, the optical component is encapsulated within an interior region defined by the recess in the substrate, an inner surface of an opening in the second section, and the underside of the cap; and
    fixing the cap to the second section with the optical component aligned with the optical fiber to allow an optical signal to be coupled between the fiber and the optical component.

25. The method of claim 24 wherein fixing the second section to the substrate includes:
    applying a solder paste to the substrate; and
    fusing the second section to the substrate.

26. The method of claim 24 wherein providing a material through a hole in the second section includes at least partially filling the hole with solder.

27. The method of claim 24 including forming a hermetic seal at a location where the fiber passes between the substrate and the second section.

28. The method of claim 24 wherein providing a material through a hole in the second section includes at least partially filling the hole with an adhesive.

29. The method of claim 24 wherein providing a material through a hole in the second section includes at least partially filling the hole with a polymer.

30. The method of claim 24 including:
    providing a hermetically sealed conductive through-hole extending from an exterior of the cap to the underside of the cap; and
    electrically coupling the optical component to the conductive through-hole.

31. The method of claim 30 wherein providing a conductive through-hole includes forming the through-hole using a double-sided etching process.

32. The method of claim 30 wherein providing a conductive through-hole includes forming the through-hole using an electro-plated feed-through metallization process.

33. The method of claim 24 including checking alignment of the optical component with the optical fiber prior to fixing the cap to the second section.

34. The method of claim 24 wherein fixing the cap to the second section includes:
    providing a solder ring on the cap;
    applying an adhesive to the cap;
    aligning the optical component to the fiber by electrically contacting the optical component through a backside of the cap and moving the cap to a position where optical coupling between the optical fiber and the optical component is at a maximum;
    hardening the adhesive; and
    re-flowing the solder ring to seal the interior region.

35. The method of claim 24 wherein fixing the cap to the second section includes:
    aligning the optical component to the fiber by electrically contacting the optical component through a backside of the cap and moving the cap to a first position where optical coupling between the optical fiber and the optical component is at a maximum;
    moving the cap back by a predetermined distance to a second position;
    placing a solder ring on the second section;
    melting the solder ring;
    moving the cap back to the first position so that the cap comes into contact with molten solder on the second section;
    allowing a seal to be formed between the second section and the cap as the solder cools.

36. The method of claim 24 wherein fixing the second section to the substrate includes soldering the second section to the substrate at a first temperature, and wherein fixing the cap to the second section includes soldering the cap to the second section at a second lower temperature.

* * * * *